(12) United States Patent
Jung et al.

(10) Patent No.: US 10,559,363 B2
(45) Date of Patent: Feb. 11, 2020

(54) SEMICONDUCTOR MEMORY DEVICE AND METHOD RELATED TO OPERATING THE SEMICONDUCTOR MEMORY DEVICE

(71) Applicant: SK hynix Inc., Icheon-si, Gyeonggi-do (KR)

(72) Inventors: Dong Jae Jung, Cheongju-si (KR); Sung Won Bae, Icheon-si (KR); Min Kyu Lee, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/154,165

(22) Filed: Oct. 8, 2018

(65) Prior Publication Data
US 2019/0267098 A1    Aug. 29, 2019

(30) Foreign Application Priority Data
Feb. 26, 2018  (KR) .......................... 10-2018-0023156

(51) Int. Cl.
| | | |
|---|---|---|
| *G11C 16/26* | (2006.01) |
| *G11C 16/08* | (2006.01) |
| *G11C 15/04* | (2006.01) |
| *G11C 16/34* | (2006.01) |
| *G11C 16/24* | (2006.01) |

(52) U.S. Cl.
CPC .............. *G11C 16/26* (2013.01); *G11C 15/04* (2013.01); *G11C 16/08* (2013.01); *G11C 16/24* (2013.01); *G11C 16/3454* (2013.01)

(58) Field of Classification Search
CPC ......... G11C 16/26; G11C 15/04; G11C 16/08; G11C 16/24
USPC .................... 365/185.13, 185.03, 185.17
See application file for complete search history.

(56) References Cited

U.S. PATENT DOCUMENTS

| | | | | |
|---|---|---|---|---|
| 9,478,289 | B1 * | 10/2016 | Hong .................. | G11C 15/04 |
| 2010/0322024 | A1 * | 12/2010 | Yagishita ............. | G11C 29/24 |
| | | | | 365/200 |
| 2014/0289574 | A1 * | 9/2014 | Tsern .............. | G11C 29/50016 |
| | | | | 714/718 |
| 2017/0371565 | A1 * | 12/2017 | Liu ................... | G06F 3/0613 |
| 2018/0040362 | A1 * | 2/2018 | Kwak ................. | G11C 7/12 |

FOREIGN PATENT DOCUMENTS

| | | |
|---|---|---|
| KR | 100891406 B1 | 4/2009 |
| KR | 1020160068570 A | 6/2016 |

\* cited by examiner

*Primary Examiner* — Han Yang
(74) *Attorney, Agent, or Firm* — William Park & Associates Ltd.

(57) ABSTRACT

The semiconductor memory device may include a memory cell array and a peripheral circuit. The memory cell array may include a plurality of memory blocks. The peripheral circuit may perform a multi-page read operation on a selected memory block among the plurality of memory blocks. The peripheral circuit may select a first word line and a second word line, which are coupled to the selected memory block, and perform the multi-page read operation on the first and second word lines.

16 Claims, 15 Drawing Sheets

SEMICONDUCTOR MEMORY DEVICE AND METHOD RELATED TO OPERATING THE SEMICONDUCTOR MEMORY DEVICE

CROSS-REFERENCE TO RELATED APPLICATION

The present application claims priority under 35 U.S.C. § 119(a) to Korean patent application number 10-2018-0023156 filed on Feb. 26, 2018, in the Korean Intellectual Property Office, the entire disclosure of which is incorporated herein by reference.

BACKGROUND

1. Technical Field

The present disclosure generally relates to an electronic device, and more particularly, to a semiconductor memory device and a method related to operating the semiconductor memory device.

2. Related Art

Memory devices may be formed in a two-dimensional structure in which strings are arranged horizontally to a semiconductor substrate, or be formed in a three-dimensional structure in which strings are arranged vertically to a semiconductor substrate. A three-dimensional semiconductor device is a memory device devised in order to overcome the limit of degree of integration in two-dimensional semiconductor devices, and may include a plurality of memory cells vertically stacked on a semiconductor substrate.

SUMMARY

According to an aspect of the present disclosure, a semiconductor memory device including a memory cell array and a peripheral circuit may be provided. The memory cell array may include a plurality of memory blocks. The peripheral circuit may be configured to perform a multi-page read operation on a selected memory block among the plurality of memory blocks. The peripheral circuit may select a first word line and a second word line, which are coupled to the selected memory block, and perform the multi-page read operation on the first and second word lines.

According to another aspect of the present disclosure, a method for operating a semiconductor memory device including a plurality of memory blocks may be provided. The method may include receiving a read command and an address corresponding to the read command. The method may additionally include performing a multi-page read operation corresponding to the received address. In the performing of the multi-page read operation, data of a plurality of pages corresponding to a plurality of word lines coupled to a selected memory block may be simultaneously read.

According to still another aspect of the present disclosure, a method for operating a semiconductor memory device including a memory block having at least one page group may be provided. The method may include receiving a read command for the memory block having the at least one page group and an address corresponding to the read command. The method may additionally include performing a multi-page read operation on a selected page group corresponding to the received address. In the performing of the multi-page read operation, data of physical pages included in the selected page group are simultaneously read.

BRIEF DESCRIPTION OF THE DRAWINGS

Examples of embodiments will now be described in detail hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
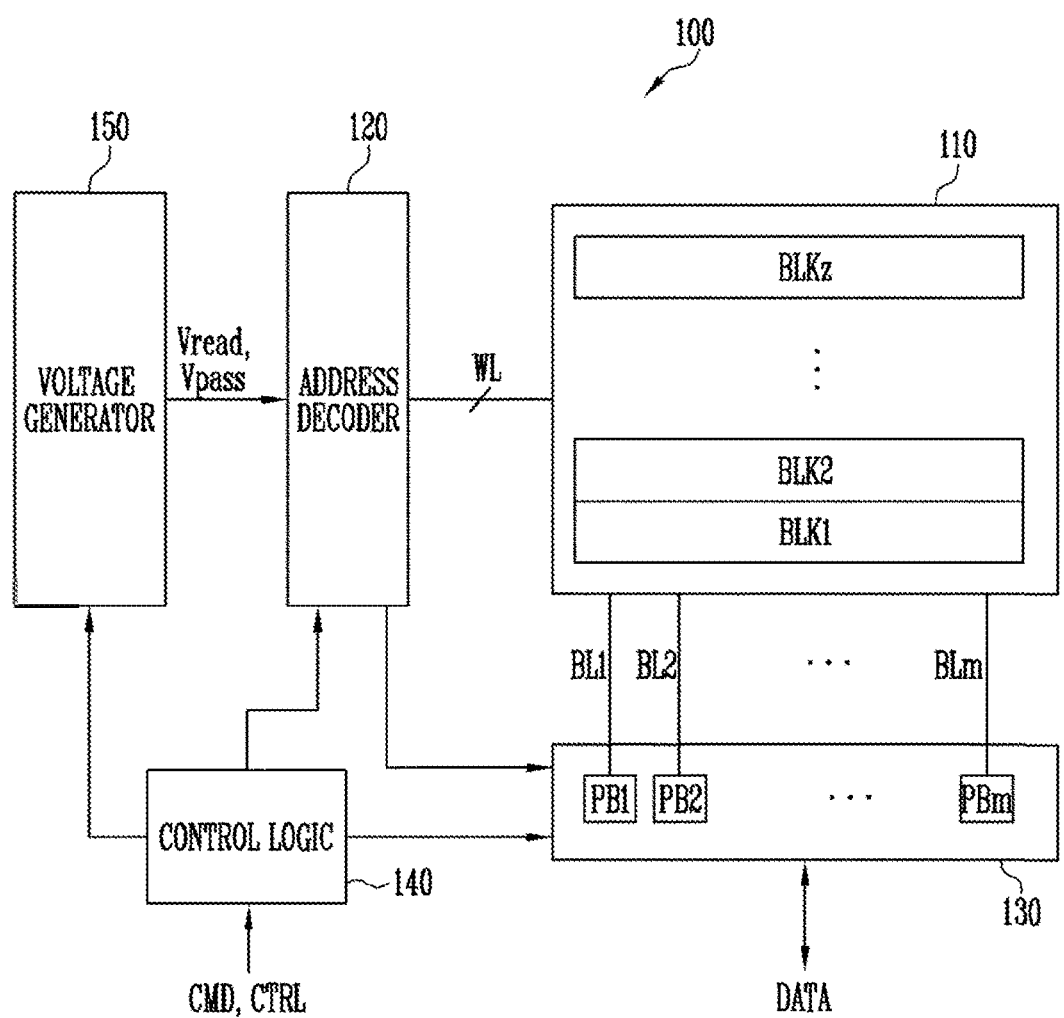
FIG. 1 is a block diagram illustrating a semiconductor memory device according to an embodiment of the present disclosure.

In the following detailed description, only certain examples of embodiments of the present disclosure have been illustrated and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Hereinafter, examples of embodiments of the present disclosure will be described in detail with reference to the accompanying drawings. The same reference numerals are used to designate the same elements as those illustrated in other drawings. In the following descriptions, only portions necessary for understanding operations according to the examples of embodiments may be described, and descriptions of the other portions may be omitted so as to not obscure important concepts of the described embodiments.

Various embodiments may provide a semiconductor memory device having improved reliability.

Various embodiments may also provide a method for operating a semiconductor memory device having improved reliability.

FIG. 1 is a block diagram illustrating a semiconductor memory device according to an embodiment of the present disclosure.

Referring to FIG. 1, the semiconductor memory device 100 may include a memory cell array 110, an address decoder 120, a read/write circuit 130, a control logic 140, and a voltage generator 150.

The memory cell array 110 may include a plurality of memory blocks BLK1 to BLKz. The plurality of memory blocks BLK1 to BLKz may be coupled to the address decoder 120 through word lines WL. The plurality of memory blocks BLK1 to BLKz may be coupled to the read/write circuit 130 through bit lines BL1 to BLm. Each of the plurality of memory blocks BLK1 to BLKz may include a plurality of memory cells. In an embodiment, the plurality of memory cells may be nonvolatile memory cells, and may be configured as nonvolatile memory cells having a vertical channel structure. The memory cell array 110 may be configured as a memory cell array having a two-dimensional structure. In some embodiments, the memory cell array 110 may be configured as a memory cell array having a three-dimensional structure. Meanwhile, each of the plurality of memory cells included in the memory cell array 110 may store data of at least one bit. In an embodiment, each of the plurality of memory cells included in the memory cell array 110 may be a single-level cell (SLC) that stores data of one bit. In another embodiment, each of the plurality of memory cells included in the memory cell array 110 may be a multi-level cell (MLC) that stores data of two bits. In still another embodiment, each of the plurality of memory cells included in the memory cell array 110 may be a triple-level cell that stores data of three bits. In still another embodiment, each of the plurality of memory cells included in the memory cell array 110 may be a quad-level cell that stores data of four bits. In some embodiments, the memory cell array 110 may include a plurality of memory cells that each stores data of five or more bits.

According to an embodiment of the present disclosure, at least one memory block among the plurality of memory blocks BLK1 to BLKz may be defined as a content addressable memory (CAM) block for storing data about an option parameter with respect to the semiconductor memory device 100, data about initial setting read voltage indices, and data about a read retry table, and the other memory blocks BLK1 to BLKz−1 may be defined as normal memory blocks.

The CAM block and the normal memory block may have the same structure. Specifically, conditions set related to a data input/output operation or other information may be stored in the CAM block. In an embodiment, a read/write performance number (P/E cycle), a bad column address, and bad block information may be stored in the CAM block. In an embodiment, optional information required to perform an operation of the semiconductor memory device 100, e.g., program voltage information, read voltage information, erase voltage information, information on the thickness of a gate oxide layer of a cell, or the like may be stored in the CAM block. In an embodiment, repair information may be stored in the CAM block. When power is supplied to the semiconductor memory device 100, information stored in the CAM block may be read by a peripheral circuit, and the peripheral circuit may control the memory cell array to perform an input/output operation of memory cells under a condition set based on the read information.

In some embodiments, the address decoder 120, the read/write circuit 130, the control logic 140, and the voltage generator 150 may operate as a peripheral circuit that drives the memory cell array 110. In other embodiments, the address decoder 120, the read/write circuit 130, and the voltage generator 150 may operate as a peripheral circuit that drives the memory cell array 110. The address decoder 120 may be coupled to the memory cell array 110 through the word lines WL. The address decoder 120 may be configured to operate under the control of the control logic 140. The address decoder 120 may receive an address through an input/output buffer (not illustrated) provided in the semiconductor memory device 100. When power is supplied to the semiconductor memory device 100, information stored in the CAM block may be read by the peripheral circuit, and the peripheral circuit may control the memory cell array to perform an input/output operation of memory cells under a condition set based on the read information.

The address decoder 120 may be configured to decode a block address in the received address. The address decoder 120 may select at least one memory block according to the decoded block address. In a read voltage application operation during a read operation, the address decoder 120 may apply a read voltage Vread generated by the voltage generator 150 to a selected word line of the selected memory block, and may apply a pass voltage Vpass to the other unselected word lines. In a program verify operation, the address decoder 120 may apply a verify voltage generated by the voltage generator 150 to the selected word line of the selected memory block, and may apply the pass voltage Vpass to the other unselected word lines.

The address decoder 120 may be configured to decode a column address in the received address. The address decoder 120 may transmit the decoded column address to the read/write circuit 130.

Read and program operations of the semiconductor memory device 100 may be performed in units of pages. An address received in a request of the read operation and the program operation may include a block address, a row address, and a column address. The address decoder 120 may select one memory block and one word line according to the block address and the row address. The column address may be decoded by the address decoder 120 to be provided to the read/write circuit 130. In this specification, memory cells coupled to one word line may be designated as a "physical page."

The address decoder 120 may include a block decoder, a row decoder, a column decoder, an address buffer, and the like.

The read/write circuit 130 may include a plurality of page buffers PB1 to PBm. The read/write circuit 130 may operate as a "read circuit" in a read operation of the memory cell array 110, and may operate as a "write circuit" in a write operation of the memory cell array 110. The plurality of page buffers PB1 to PBm may be coupled to the memory cell array 110 through the bit lines BL1 to BLm. In order to sense threshold voltages of memory cells in the read operation and the program verify operation, the plurality of page buffers PB1 to PBm may sense a change in the amount of current flowing depending on a program state of a corresponding memory cell while continuously supplying sensing current to bit lines coupled to the memory cells, and may latch the sensed change as sensing data. The read/write circuit 130 may operate in response to page buffer control signals output from the control logic 140.

In the read operation, the read/write circuit 130 may temporarily store read data by sensing data of a memory cell and then output data DATA to the input/output buffer (not illustrated) of the semiconductor memory device 100. In an example embodiment, the read/write circuit 130 may include a column selection circuit, and the like, in addition to the page buffers (or page registers).

The control logic 140 may be coupled to the address decoder 120, the read/write circuit 130, and the voltage generator 150. The control logic 140 may receive a command CMD and a control signal CTRL through the input/output buffer (not illustrated) of the semiconductor memory device 100. The control logic 140 may be configured to control overall operations of the semiconductor memory device 100 in response to the control signal CTRL. Also, the control logic 140 may output a control signal for controlling sensing node precharge potential levels of the plurality of page buffers PB1 to PBm. The control logic 140 may control the read/write circuit 130 to perform the read operation of the memory cell array 110. In an embodiment, the control logic 140 may be implemented with software, hardware, or any combination thereof.

In the read operation, the voltage generator 150 may generate the read voltage Vread and the pass voltage Vpass in response to a control signal output from the control logic 140. In order to generate a plurality of voltages having various voltage levels, the voltage generator 150 may include a plurality of pumping capacitors for receiving an internal power voltage, and may generate a plurality of voltages by selectively activating the plurality of pumping capacitors under the control of the control logic 140.

The address decoder 120, the read/write circuit 130, and the voltage generator 150 may serve as a "peripheral circuit" that performs a read operation, a write operation, and an erase operation on the memory cell array 110. The peripheral circuit may perform the read operation, the write operation, and the erase operation on the memory cell array 110 under the control of the control logic 140.

The above-described optional information related to the operation of the semiconductor memory device 100 may be stored in the CAM block in a packaging process of the semiconductor memory device 100. After the semiconductor memory device is released as a product, data stored in the CAM block is not changed. The data stored in the CAM block is to be maintained even when time elapses, but threshold voltages of memory cells constituting the CAM block may be changed when time elapses.

The semiconductor memory device 100 according to an embodiment of the present disclosure may select a first word line and a second word line, which are coupled to a selected memory block, and may perform a multi-page read operation on the selected first and second word lines. Accordingly, data may be stably read even when threshold voltages of some memory cells of the memory block are decreased. Consequently, the operational reliability of the semiconductor memory device 100 may be improved.

Figure 2:
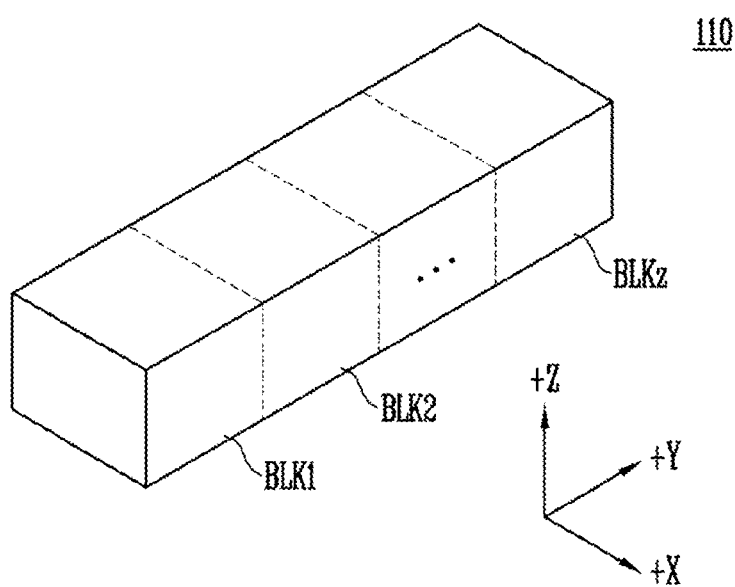
FIG. 2 is a diagram illustrating an embodiment of a memory cell array of FIG. 1.

FIG. 2 is a diagram illustrating an embodiment of the memory cell array of FIG. 1.

Referring to FIG. 2, the memory cell array 110 may include a plurality of memory blocks BLK1 to BLKz. Each memory block may have a three-dimensional structure. Each memory block may include a plurality of memory cells stacked above a substrate. The plurality of memory cells may be arranged along +X, +Y, and +Z directions. The structure of each memory block will be described in detail with reference to FIGS. 3 and 4.

Figure 3:
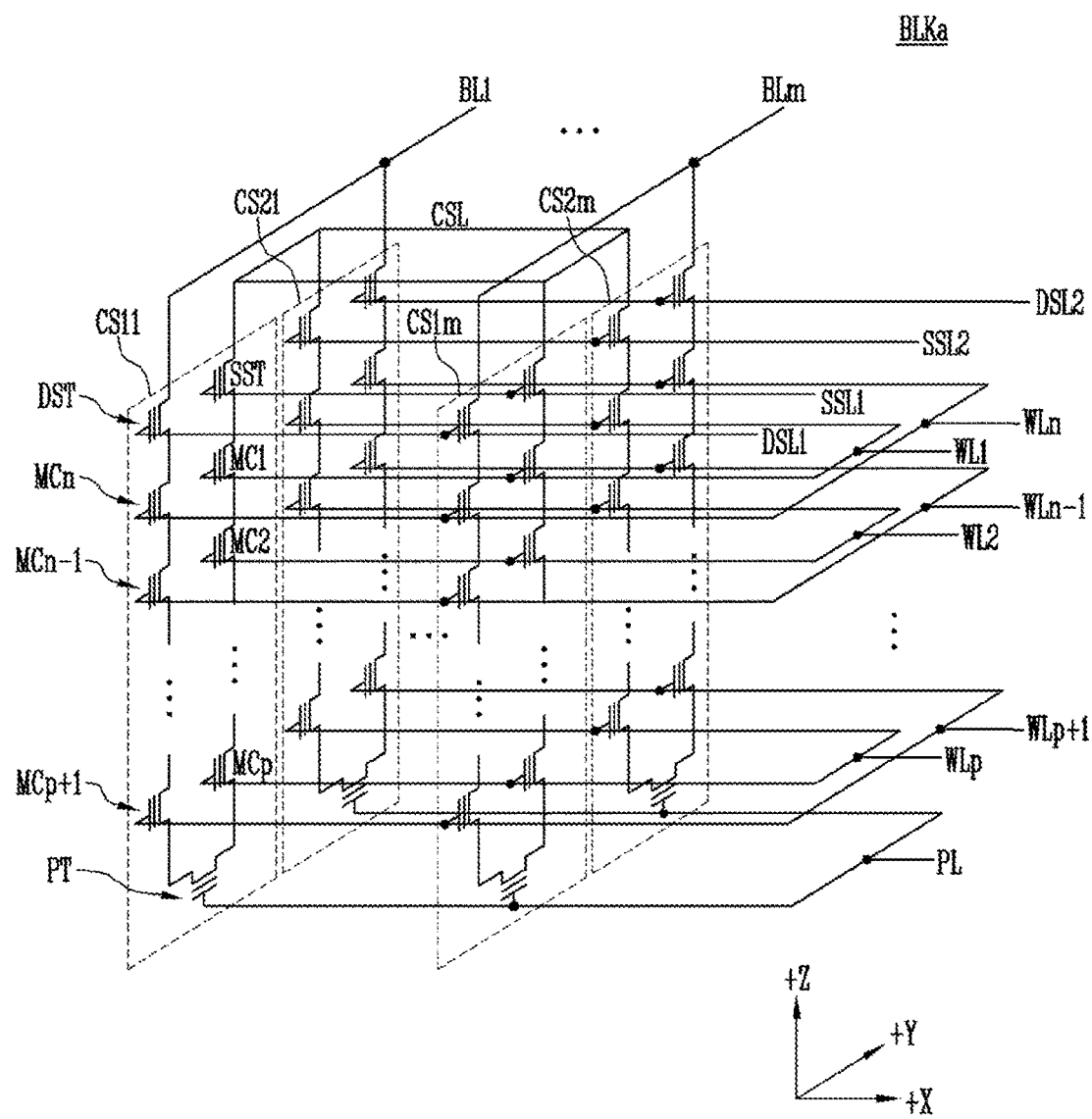
FIG. 3 is a circuit diagram illustrating any one memory block among memory blocks of FIG. 2.

FIG. 3 is a circuit diagram illustrating any one memory block BLKa among the memory blocks BLK1 to BLKz of FIG. 2.

Referring to FIG. 3, the memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings may be arranged in a row direction (i.e., a +X direction). In FIG. 3, it is illustrated that two cell strings may be arranged in a column direction (i.e., a +Y direction). However, this is for convenience of description, and it will be understood that three or more cell strings may also be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string may be coupled between a common source line CSL and memory cells MC1 to MCp.

In an embodiment, the source select transistors of cell strings arranged on the same row may be coupled to a source select line extending in the row direction, and the source select transistors of cell strings arranged on different rows are coupled to different source select lines. In FIG. 3, the source select transistors of the cell strings CS11 to CS1m on a first row may be coupled to a first source select line SSL1. The source select transistors of the cell strings CS21 to CS2m on a second row may be coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string may be coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp may be sequentially arranged in the opposite direction of a +Z direction, and may be coupled in series between the source select transistor SST and the pipe transistor PT. The (p+1)th to nth memory cells MCp+1 to MCn may be sequentially arranged in the +Z direction, and may be coupled in series between the pipe transistor PT and the drain select transistor DST. The first to pth memory cells MC1 to MCp and the (p+1)th to nth memory cells MCp+1 to MCn may be coupled through the pipe transistor PT. Gate electrodes of the first to nth memory cells MC1 to MCn of each cell string may be coupled to first to nth word lines WL1 to WLn, respectively.

A gate of the pipe transistor PT of each cell string may be coupled to a pipe line PL.

The drain select transistor DST of each cell string may be coupled between a corresponding bit line and the memory cells MCp+1 to MCn. Cell strings arranged in the row direction may be coupled to a drain select line extending in the row direction. The drain select transistors of the cell strings CS11 to CS1m on the first row may be coupled to a first drain select line DSL1. The drain select transistors of the cell strings CS21 to CS2m on the second row may be coupled to a second drain select line DSL2.

Cell strings arranged in the column direction may be coupled to a bit line extending in the column direction. In FIG. 3, the cell strings CS11 and CS21 on a first column may be coupled to a first bit line BL1. The cell strings CS1m and CS2m on an mth column may be coupled to an mth bit line BLm.

Memory cells coupled to the same word line in the cell strings arranged in the row direction may constitute one page. For example, memory cells coupled to the first word line WL1 in the cell strings CS11 to CS1m on the first row may constitute one page. Memory cells coupled to the first word line WL1 in the cell strings CS21 to CS2m on the second row may constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. As a larger number of dummy memory cells are provided, the reliability of an operation of the memory block BLKa may be improved. On the other hand, the size of the memory block BLKa may be increased. As a smaller number of dummy memory cells are provided, the size of the memory block BLKa may be decreased. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the dummy memory cells can have the required threshold voltage by controlling a voltage applied to the dummy word lines coupled to the respective dummy memory cells.

Figure 4:
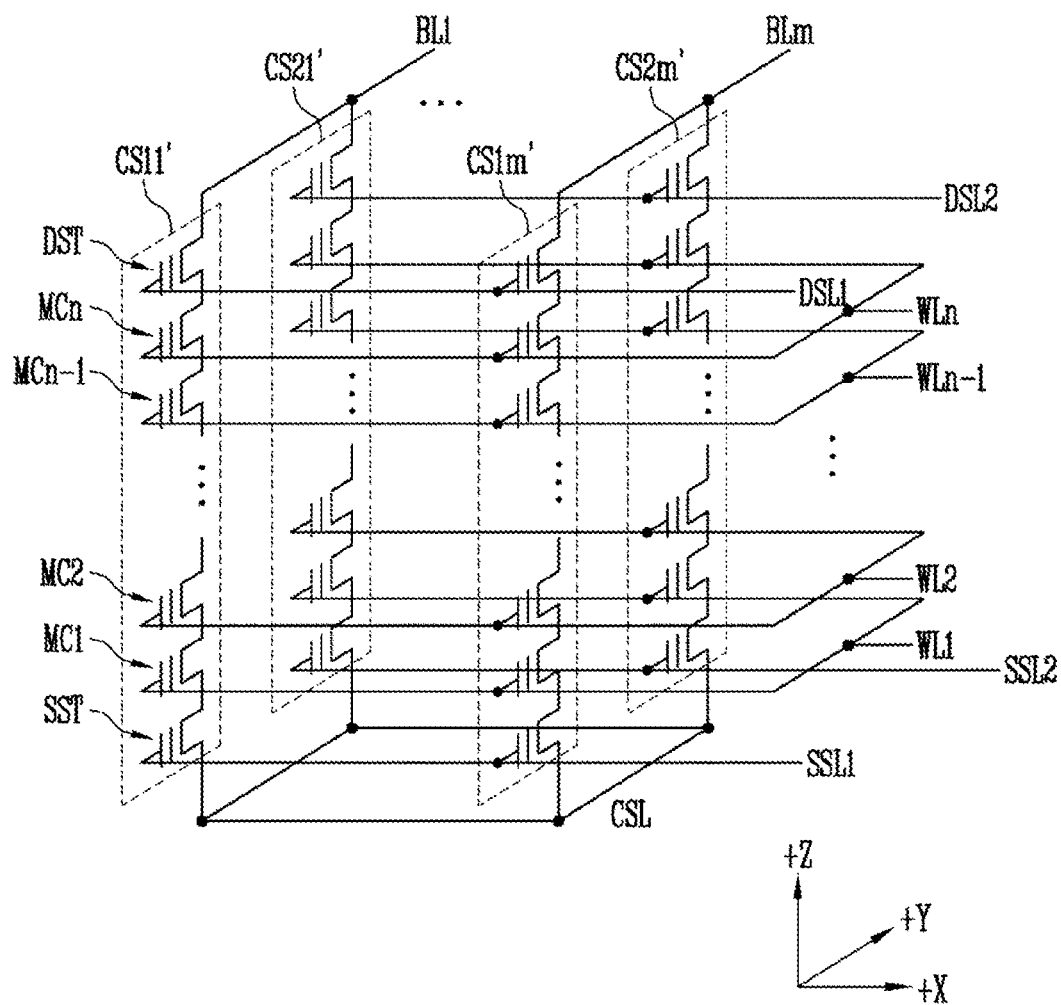
FIG. 4 is a circuit diagram illustrating another embodiment of the one memory block among the memory blocks of FIG. 2.

FIG. 4 is a circuit diagram illustrating another embodiment BLKb of the one memory block among the memory blocks BLK1 to BLKz of FIG. 2.

Referring to FIG. 4, the memory block BLKb may include a plurality of cell strings CS11' to CS1m' and CS21' to CS2m'. Each of the plurality of cell strings CS11' to CS1m' and CS21' to CS2m' may extend along the +Z direction. Each of the plurality of cell strings CS11' to CS1m' and CS21' to CS2m' may include at least one source select transistor SST, first to nth memory cells MC1 to MCn, and at least one drain select transistor DST, which may be stacked on a substrate (not illustrated) under the memory block BLKb.

The source select transistor SST of each cell string may be coupled between a common source line CSL and the memory cells MC1 to MCn. The source select transistors of cell strings arranged on the same row may be coupled to the same source select line. The source select transistors of the cell strings CS11' to CS1m' arranged on a first row may be coupled to a first source select line SSL1. Source select transistors of the cell strings CS21' to CS2m' arranged on a second row may be coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string may be coupled in series between the source select transistor SST and the drain select transistor DST. Gate electrodes of the first to nth memory cells MC1 to MCn may be coupled to first to nth word lines WL1 to WLn, respectively.

The drain select transistor DST of each cell string may be coupled between a corresponding bit line and the memory cells MC1 to MCn. The drain select transistors of cell strings arranged in the row direction may be coupled to a drain select line extending in the row direction. The drain select transistors of the cell strings CS11' to CS1m' on the first row may be coupled to a first drain select line DSL1. The drain select transistors of the cell strings CS21' to CS2m' on the second row may be coupled to a second drain select line DSL2.

Consequently, the memory block BLKb of FIG. 4 has a circuit similar to that of the memory block BLKa of FIG. 3, except that the pipe transistor PT may be excluded from each cell string.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCn. Alternatively, the at least one dummy memory cell may be provided to decrease an electric field between the drain select transistor DST and the memory cells MC1 to MCn. As a larger number of dummy memory cells are provided, the reliability of an operation of the memory block BLKb may be improved. On the other hand, the size of the memory block BLKb may be increased. As a smaller number of dummy memory cells are provided, the size of the memory block BLKb may be decreased. On the other hand, the reliability of an operation of the memory block BLKb may deteriorate.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the dummy memory cells can have the required threshold voltage by controlling a voltage applied to the dummy word lines coupled to the respective dummy memory cells.

Figure 5:
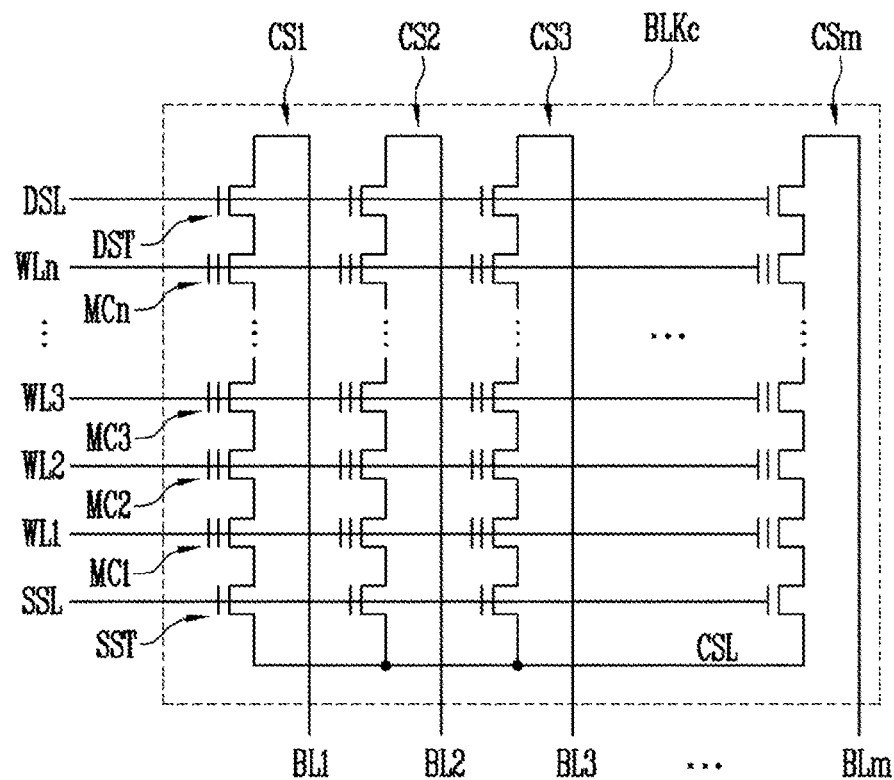
FIG. 5 is a circuit diagram illustrating an embodiment of any one memory block among a plurality of memory blocks included in the memory cell array of FIG. 1.

FIG. 5 is a circuit diagram illustrating an embodiment of any one memory block BLKc among the plurality of memory blocks BLK1 to BLKz included in the memory cell array 110 of FIG. 1.

Referring to FIG. 5, the memory block BLKc may include a plurality of strings CS1 to CSm. The plurality of strings CS1 to CSm may be coupled to a plurality of bit lines BL1 to BLm, respectively. Each of the plurality of strings CS1 to CSm may include at least one source select transistor SST, first to nth memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string may be coupled between a common source line CSL and the memory cells MC1 to MCn. The source select transistor SST of each cell string may be coupled to a source select line SSL.

The first to nth memory cells MC1 to MCn of each cell string may be coupled between the source select transistor SST and the drain select transistor DST.

The drain select transistor DST of each cell string may be coupled between a corresponding bit line and the memory cells MC1 to MCn.

Memory cells coupled to the same word line may constitute one page. As a drain select line DSL is selected, the cell strings CS1 to CSm may be selected. As any one of word lines WL1 to WLn is selected, one page among selected cell strings may be selected.

In another embodiment, even bit lines and odd bit lines may be provided instead of the first to mth bit lines BL1 to BLm. Even-numbered cell strings among the cell strings CS1 to CSm may be coupled to the even bit lines, respectively, and odd-numbered cell strings among the cell strings CS1 to CSm may be coupled to the odd bit lines, respectively.

As described above, memory cells coupled to one word line may constitute one physical page. Referring to FIG. 5, m memory cells coupled to any one word line among the plurality of word lines WL1 to WLn among the memory cells belonging to the memory block BLKc may constitute one physical page.

Although the memory cell array 110 of the semiconductor memory device 100 may be configured in a three-dimensional structure as illustrated in FIGS. 2 to 4, the memory cell array 110 of the semiconductor memory device 100 may be configured in a two-dimensional structure as illustrated in FIG. 5.

Figure 6A:
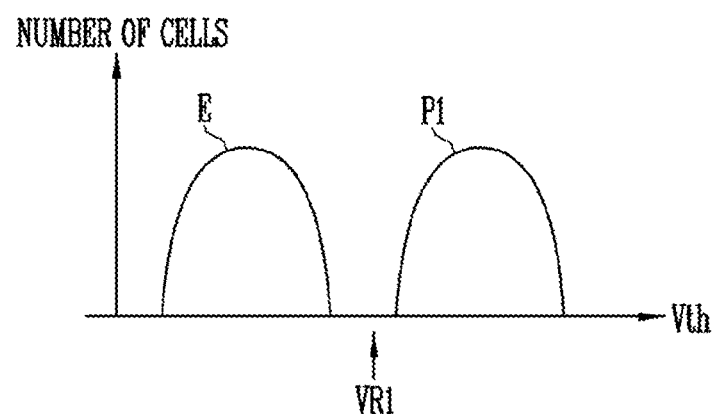
FIGS. 6A and 6B are diagrams illustrating a change in threshold voltage of a memory cell.
Figure 6B:
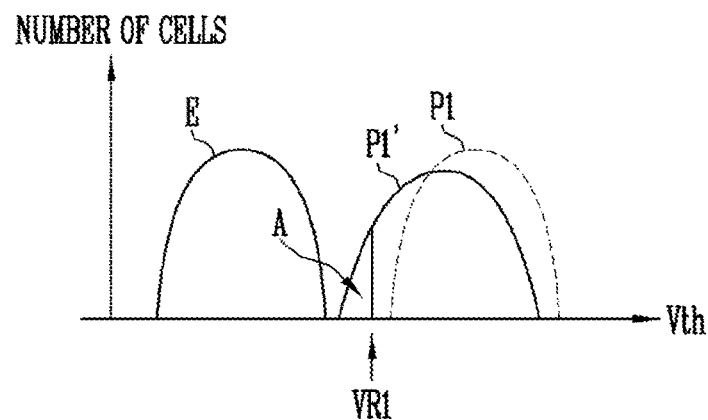
Figure 7:
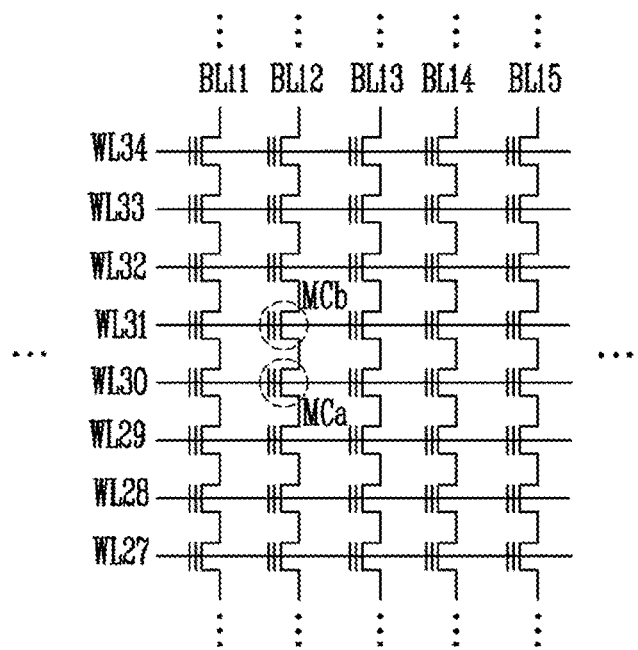
FIG. 7 is a circuit diagram illustrating a read error of a memory cell when a threshold voltage of the memory cell is changed.

FIGS. 6A and 6B are diagrams illustrating a change in threshold voltage of a memory cell. FIG. 7 is a circuit diagram illustrating a read error of a memory cell when a threshold voltage of the memory cell is changed.

Referring to FIG. 6A, threshold voltage distributions of single-level cells (SLCs) are illustrated. More specifically, FIG. 6A illustrates threshold voltage distributions of SLCs just after a program operation. In the graph of FIG. 6A (and the graph of FIG. 6B), the horizontal axis represents threshold voltages Vth of memory cells, and the vertical axis represents numbers of memory cells corresponding to the threshold voltages Vth.

A SLC stores data of one bit. Accordingly, a threshold voltage of the SLC may be included in a distribution corresponding to any one of an erase state E or a program state P1. In the threshold voltage distributions illustrated in FIG. 6A, bit data stored in a memory cell may be read according to a read voltage VR1. For example, the read voltage VR1 may be applied to a gate electrode of a memory cell. When the memory cell is turned on, it may be determined that the memory cell is in the erase state E. When the memory cell is turned off, it may be determined that the memory cell is in the program state P1. Accordingly, bit data stored in the memory cell can be read.

FIG. 6B illustrates movement of threshold voltages according to retention characteristics of memory cells. The threshold voltage distributions illustrated in FIG. 6A may be maintained just after the memory cells are programmed. However, as time elapses after the memory cells are programmed, a distribution corresponding to the program state P1 may be changed to a program state P1' as illustrated in FIG. 6B. This is because electrons captured in trap layers of memory cells corresponding to the program state P1 may be gradually moved to the outside of the trap layers. Therefore, when the read voltage VR1 is applied, bit data of memory cells belonging to area A may be abnormally read. According to a read method, a read operation may be performed by changing the magnitude of the read voltage VR1 when a read error is generated. However, when the movement width of a threshold voltage distribution is large, an error may be repeatedly generated even though the read voltage is changed.

Referring to FIG. 7 together with FIGS. 6A and 6B, a portion of a memory block BLK is illustrated. More specifically, there are illustrated memory cells defined by twenty-seventh to thirty-fourth word lines WL27 to WL34 and eleventh to fifteenth bit lines BL11 to BL15 of the memory block BLK.

It is assumed that memory cells MCa and MCb may be programmed to be initially included in the program state P1, but their threshold voltages may be decreased when time elapses. For example, the threshold voltage of the memory cell MCa may be lower than the read voltage VR1. Meanwhile, the threshold voltage of the memory cell MCb may maintain a level higher than that of the read voltage VR1. Therefore, bit data stored in the memory cell MCa might not be normally read. On the other hand, bit data stored in the memory cell MCb may be normally read.

The above-described CAM block may store several information necessary for an operation of the semiconductor memory device 100. Therefore, when the threshold voltage distribution of the memory cells belonging to the CAM block is changed as illustrated in FIG. 6B, the semiconductor memory device 100 may abnormally operate.

Figure 8:
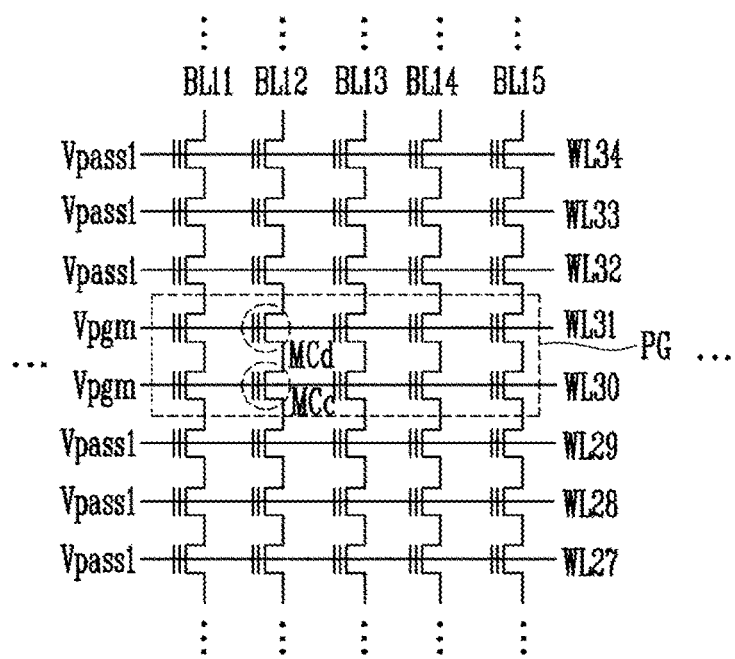
FIG. 8 is a diagram illustrating data stored in a memory block of the semiconductor memory device according to an embodiment of the present disclosure.

FIG. 8 is a diagram illustrating data stored in a memory block of the semiconductor memory device according to an embodiment of the present disclosure. FIG. 8 illustrates a portion of the memory block including memory cells defined by twenty-seventh to thirty-fourth word lines WL27 to WL34 and eleventh to fifteenth bit lines BL11 to BL15 of the memory block.

Referring to FIG. 8, at least one of the memory blocks BLK1 to BLKz of the semiconductor memory device 100 according to an embodiment of the present disclosure may include one page group PG. The page group PG may include at least two physical pages. The page group PG may include a physical page (first page) corresponding to a thirtieth word line WL30 and a physical page (second page) corresponding to a thirty-first word line WL31. The same data may be stored in the first page and the second page. In other words, a plurality of physical pages belonging to one page group PG may store the same data.

In an embodiment, the thirtieth word line WL30 and the thirty-first word line WL31 may be simultaneously selected in a program operation so as to store the same data in the first and second pages belonging to the page group PG.

A program pass voltage Vpass1 may be applied to the other unselected word lines WL27 to WL29 and WL32 to WL34. Meanwhile, a program voltage Vpgm may be simultaneously applied to the selected word lines WL30 and WL31. Accordingly, the same data may be stored in the first and second pages respectively corresponding to the selected word lines WL30 and WL31.

In the above, there has been described a method for storing the same data in the first and second pages by simultaneously applying a program pulse to the thirtieth and thirty-first word lines WL30 and WL31. However, in another embodiment, the first page corresponding to the thirtieth word line WL30 may be first programmed, and the second page corresponding to the thirty-first word line WL31 may be then programmed. In this manner, the same data may be programmed in the first and second pages.

When the same data is programmed in the first and second pages belonging to the page group PG, threshold voltages of memory cells MCc and MCd may be included in the same program state P1.

Subsequently, a multi-page read operation may be performed in a read operation on the page group PG. The multi-page read operation on the page group PG will be described with reference to FIG. 9.

Figure 9:
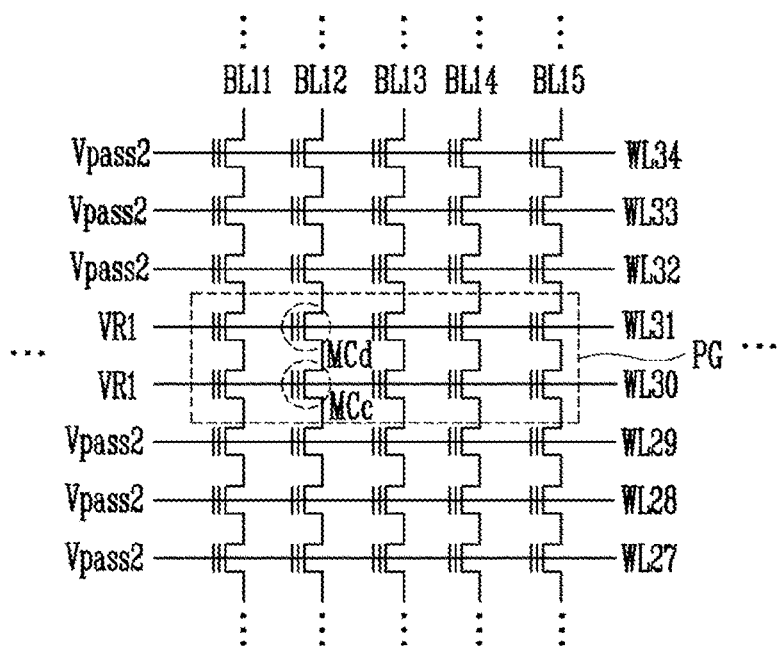
FIG. 9 is a diagram illustrating a read operation of the semiconductor memory device according to an embodiment of the present disclosure.

FIG. 9 is a diagram illustrating a read operation of the semiconductor memory device according to an embodiment of the present disclosure. FIG. 9 illustrates a portion of a memory block including memory cells defined by twenty-seventh to thirty-fourth word lines WL27 to WL34 and eleventh to fifteenth bit lines BL11 to BL15 of the memory block. Referring to FIG. 9, a multi-page read operation on a page group PG is illustrated. Hereinafter, the multi-page read operation on the page group PG will be described with reference to FIGS. 1 and 9.

The semiconductor memory device 100 may receive a read command for the page group PG from an external memory controller. More specifically, the memory controller may transfer, to the semiconductor memory device 100, a read command designating a multi-page read and a physical address corresponding thereto. The physical address may be a physical address corresponding to thirtieth and thirty-first word lines WL30 and WL31. In an embodiment, the physical address may include a first physical page address corresponding to the thirtieth word line WL30 and a second physical page address corresponding to the thirty-first word line WL31. The control logic 140 may control the voltage generator 150 and the address decoder 120 to apply a read voltage VR1 to the thirtieth and thirty-first word lines WL30 and WL31, based on the read command designating the multi-page read and the physical address corresponding thereto. Meanwhile, the control logic 140 may control the voltage generator 150 and the address decoder 120 to apply a read pass voltage Vpass2 to the other word lines.

The read voltage VR1 may be simultaneously applied to the thirtieth and thirty-first word lines WL30 and WL31 under the control of the control logic 140. An effect of the multi-page read operation will be described with reference to FIG. 10.

Figure 10:
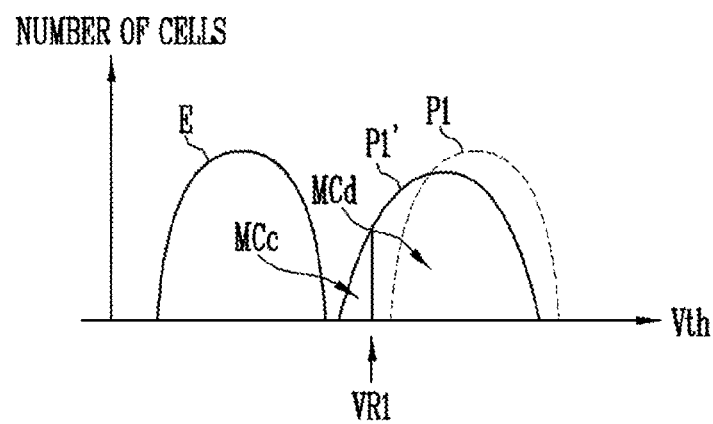
FIG. 10 is a diagram illustrating an effect of the read operation of the semiconductor memory device according to an embodiment of the present disclosure.

FIG. 10 is a diagram illustrating an effect of the read operation of the semiconductor memory device according to an embodiment of the present disclosure. Hereinafter, an effect of the multi-page read operation will be described with reference to FIGS. 9 and 10 together.

As described with reference to FIG. 8, the same data may be programmed in the plurality of physical pages belonging to the page group PG. Meanwhile, in the multi-page read, the read voltage VR1 may be simultaneously applied to the word lines WL30 and WL31 coupled to the page group PG. Hereinafter, the effect of the multi-page read operation will be described with respect to the memory cells MCc and MCd.

When both of the memory cells MCc and MCd maintain the erase state E according to the program operation illustrated in FIG. 8, both of the memory cells MCc and MCd may be turned on when the read voltage VR1 is applied to the word lines WL30 and WL31 according to the multi-page read operation. Accordingly, it can be seen that bit data stored in the memory cells MCc and MCd may be bit data corresponding to the erase state E. When both of the memory cells MCc and MCd are programmed to the program state P1 according to the program operation illustrated in FIG. 8, both of the memory cells MCc and MCd may be turned off when the read voltage VR1 is applied to the word lines WL30 and WL31 according to the multi-page read operation. Accordingly, it can be seen that the bit data stored in the memory cells MCc and MCd may be bit data corresponding to the program state P1.

Hereinafter, the effect of the multi-page read operation will be described when the memory cells MCc and MCd were initially programmed to the program state P1, but a threshold voltage distribution of the memory cells MCc and MCd is changed to the program state P1' when time elapses.

The memory cells MCc and MCd may be initially programmed to the program state P1 according to the program operation illustrated in FIG. 8. Subsequently, as illustrated in FIG. 10, the threshold voltage distribution corresponding to the program state P1 may be changed to the program state P1'. Accordingly, the threshold voltages of the memory cells MCc and MCd may be lowered. As illustrated in FIG. 10, while the threshold voltage of the memory cell MCc may be lowered to the read voltage VR1 or less, the threshold voltage of the memory cell MCd may maintain a state higher than that of the read voltage VR1.

Under the situation illustrated in FIG. 10, in the read operation, the read voltage VR1 may be applied to the thirtieth and thirty-first word lines WL30 and WL31, and the read pass voltage Vpass2 may be applied to the other word lines. Accordingly, all memory cells that are not included in the page group PG may be turned on.

Meanwhile, when the read voltage VR1 is applied to the thirtieth word line WL30, the memory cell MCc may be turned on. According to the initial program operation, the memory cell MCc is to be turned off when the read voltage VR1 is applied. However, when the read voltage VR1 is applied, the memory cell MCc may be abnormally turned on while the threshold voltage of the memory cell MCc is being lowered when time elapses.

Meanwhile, when the read voltage VR1 is applied to the thirty-first line WL31, the memory cell MCd may be turned off. From the point of view of a memory string coupled to a bit line BL12, the memory cell MCc may be abnormally turned on, but no bit line current flows when the memory cell MCd is normally turned off. Accordingly, in a page buffer coupled to the bit line BL12, it can be recognized that the bit data stored in the memory cells MCc and MCd may still be bit data corresponding to the program state P1. In other words, when even any one of the memory cells MCc and MCd maintains a threshold voltage higher than the read voltage VR1, normal data can be read.

As described above, in the semiconductor memory device according to embodiments of the present disclosure, the same data may be repeatedly programmed in the physical pages belonging to the page group PG, and the multi-page read operation may be performed in the read operation on the page group PG. Accordingly, data can be more reliably read even when the threshold voltages of the memory cells belonging to the page group PG are lowered according to the retention characteristics.

In particular, data stored in the CAM block may require high reliability as compared with data stored in the page group PG. Accordingly, when data is stored in the CAM block, data may be stored in a page group including a plurality of physical pages as illustrated in FIG. 8. When data stored in the CAM block is read, the data can be reliably read as compared with when the multi-page read operation is performed as illustrated in FIG. 9.

Figure 11:
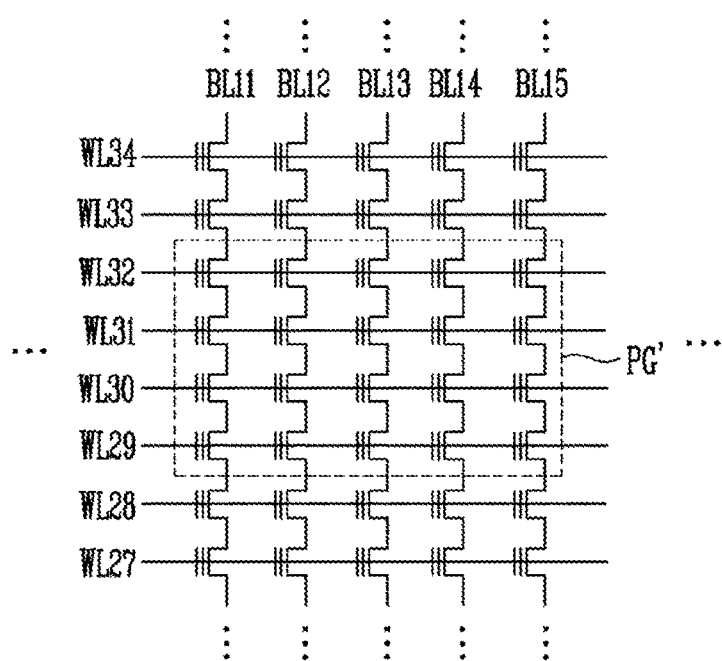
FIG. 11 is a circuit diagram illustrating an example of a page group.

FIG. 11 is a circuit diagram illustrating an example of the page group. FIG. 11 illustrates a portion of a memory block including memory cells defined by twenty-seventh to thirty-fourth word lines WL27 to WL34 and eleventh to fifteenth bit lines BL11 to BL15 of the memory block. Referring to FIG. 9, it is illustrated that the page group PG may include two physical pages corresponding to the thirtieth and thirty-first word lines WL30 and WL31. However, embodiments of the present disclosure are not limited thereto, and one page group may include various numbers of physical pages. As illustrated in FIG. 11, the page group PG' according to an example embodiment of the present disclosure may include four physical pages corresponding to the word lines WL29 to WL32.

Meanwhile, according to an embodiment of the present disclosure, one page group may include five or more physical pages.

Figure 12:
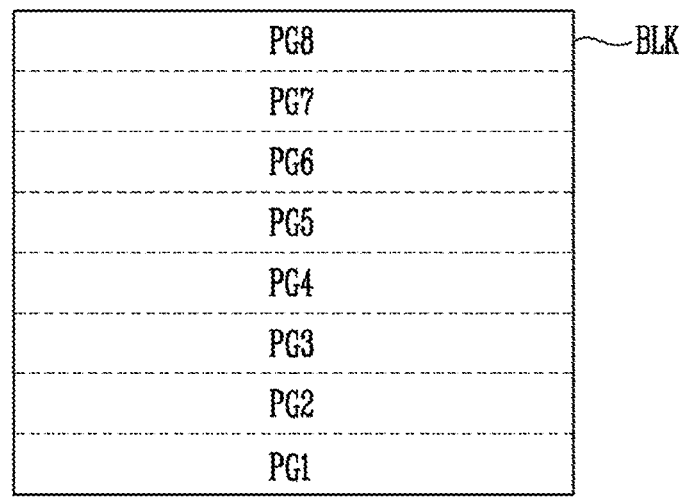
FIG. 12 is a block diagram illustrating an example of a memory block including a plurality of page groups.

FIG. 12 is a block diagram illustrating an example of a memory block including a plurality of page groups. Referring to FIG. 12, physical pages of the memory block BLK may be divided into eight page groups PG1 to PG8. However, the configuration of FIG. 12 is merely illustrative, and various numbers of page groups may be defined. For example, the memory block BLK may include only two page groups. In some embodiments, one memory block may be configured with one page group (i.e., one memory block may constitute one page group). In this case, in the multi-page read operation on the page group, the read operation may be performed by applying the read voltage VR1 to all word lines coupled to the memory block.

Meanwhile, FIG. 12 illustrates that page groups PG1 to PG8 may constitute the entire memory block BLK. However, the semiconductor memory device 100 according to embodiments of the present disclosure is not limited thereto. For example, only some areas in the memory block BLK may form the page groups. The other areas that do not form the page groups may be configured as normal physical pages.

Figure 13:
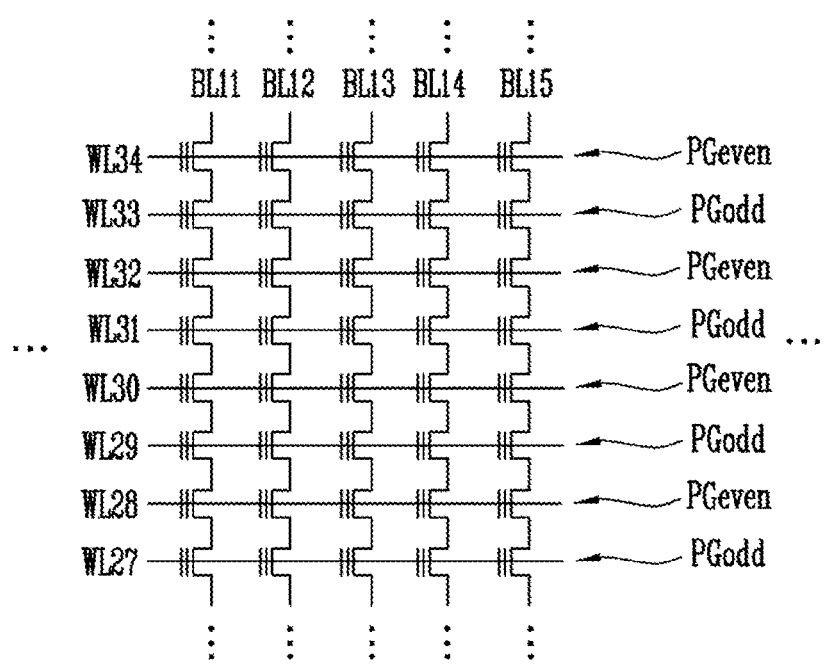
FIG. 13 is a diagram illustrating a page group according to an embodiment of the present disclosure.

FIG. 13 is a diagram illustrating a page group according to an embodiment of the present disclosure. FIG. 13 illustrates a portion of a memory block including memory cells defined by twenty-seventh to thirty-fourth word lines WL27 to WL34 and eleventh to fifteenth bit lines BL11 to BL15 of the memory block.

Referring to FIGS. 9, 11, and 12, it is illustrated that physical pages located adjacent to each other may form one page group (e.g., physical pages corresponding to the thirtieth and thirty-first word lines WL30 and WL31 may form one page group PG as illustrated in FIG. 9). However, the semiconductor memory device 100 according to embodiments of the present disclosure is not limited thereto, and physical pages located to be spaced apart from each other may form one page group.

Referring to FIG. 13, it is illustrated that physical pages corresponding to the odd-numbered word lines WL27, WL29, WL31, and WL33 may form one page group PGodd and physical pages corresponding to the even-numbered word lines WL28, WL30, WL32, and WL34 may form another page group PGeven. As illustrated in FIG. 13, physical pages located to be spaced apart from each other may form one page group. As illustrated in FIG. 13, one memory block may be divided into two page groups PGodd and PGeven.

Figure 14:
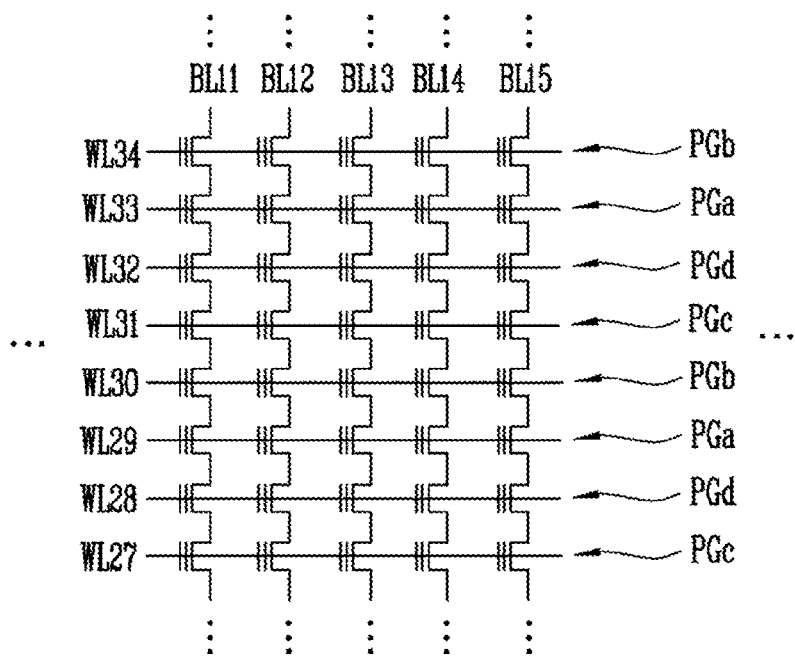
FIG. 14 is a diagram illustrating a page group according to an embodiment of the present disclosure.

FIG. 14 is a diagram illustrating a page group according to an embodiment of the present disclosure. FIG. 14 illustrates a portion of a memory block including memory cells defined by twenty-seventh to thirty-fourth word lines WL27 to WL34 and eleventh to fifteenth bit lines BL11 to BL15 of the memory block. Similarly to FIG. 13, in FIG. 14, physical pages located to be spaced apart from each other may also form one page group. In FIG. 13, one memory block may be divided into two page groups PGodd and PGeven. On the other hand, referring to FIG. 14, one memory block may be divided into four page groups PGa, PGb, PGc, and PGd.

Physical pages corresponding to (4k+1)th (k is an integer of 0 or more) word lines may be included in a first page group PGa. Physical pages corresponding to (4k+2)th word lines may be included in a second page group PGb. Physical pages corresponding to (4k+3)th word lines may be included in a third page group PGc. Physical pages corresponding to (4k+4)th word lines may be included in a fourth page group PGd.

However, the page groups illustrated in FIGS. 9 and 11 to 14 are merely illustrative, and the present disclosure is not limited thereto. In the semiconductor memory device according to embodiments of the present disclosure, page groups may be configured in various manners.

Figure 15:
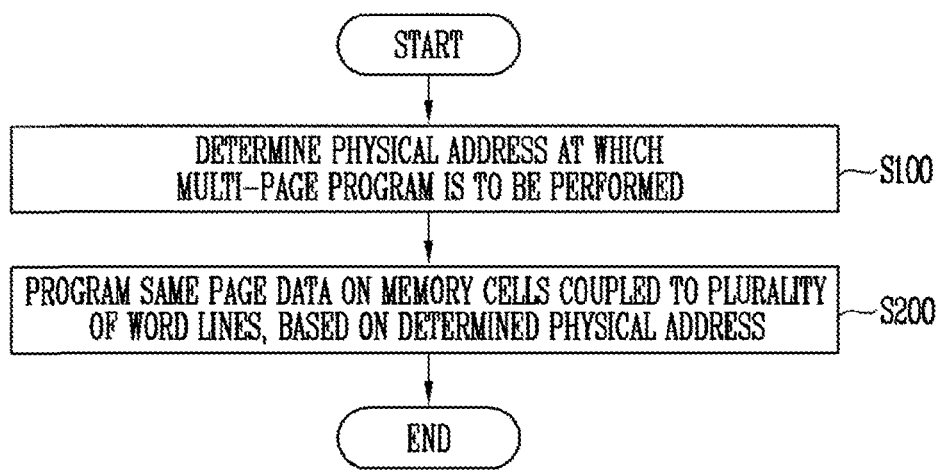
FIG. 15 is a flowchart illustrating a method for operating the semiconductor memory device according to an embodiment of the present disclosure.

FIG. 15 is a flowchart illustrating a method for operating the semiconductor memory device according to an embodiment of the present disclosure.

Referring to FIG. 15, the method for operating the semiconductor memory device according to an embodiment of the present disclosure may include a step (S100) of determining a physical address at which a multi-page program is to be performed and a step (S200) of programming the same page data on memory cells coupled to a plurality of word lines, based on the determined physical address. Hereinafter, this will be described together with reference to FIG. 8.

In step S100, a physical address at which the multi-page program is to be performed may be determined. For example, as illustrated in FIG. 8, a physical address corresponding to the word lines WL30 and WL31 may be determined. Subsequently, in step S200, the same page data may be programmed in the physical pages corresponding to the selected word lines WL30 and WL31. That is, the multi-page program may be performed at the physical address selected by step S100. A detailed embodiment of step S200 will be described later with reference to FIGS. 16 and 17.

Figure 16:
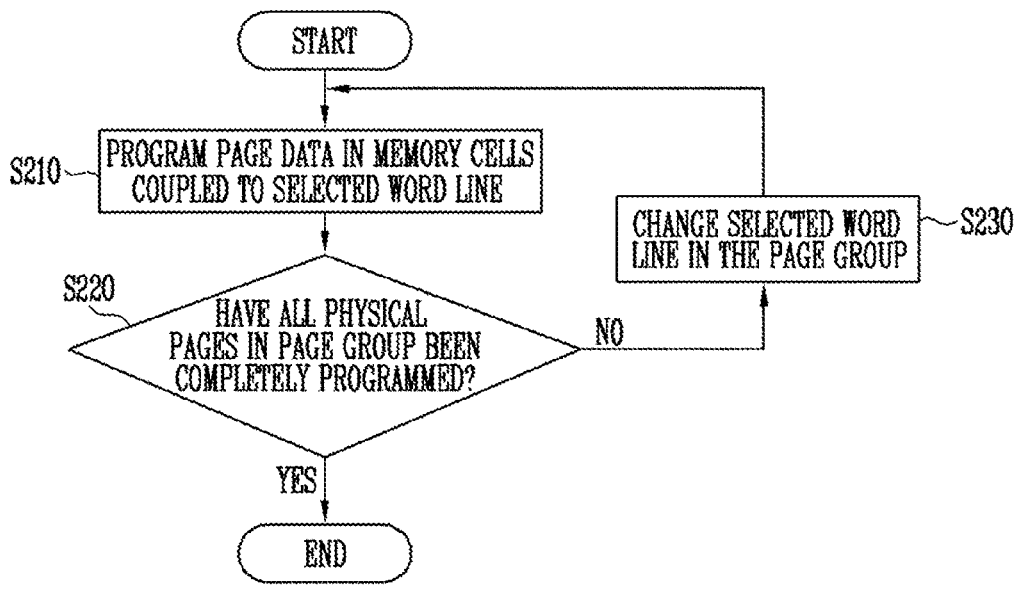
FIG. 16 is a flowchart illustrating an example embodiment of a multi-page program operation.

FIG. 16 is a flowchart illustrating an example embodiment of the multi-page program operation. That is, an example embodiment of step S200 of FIG. 15 is illustrated in FIG. 16.

First, page data may be programmed in memory cells coupled to a selected word line in step S210. For example, first data may be programmed in the physical page corresponding to the thirtieth word line WL30. Step 210 may include a plurality of program loops and a plurality of verify loops. The plurality of program loops included in step S210 may be performed according to an Incremental Step Pulse Programming (ISPP) scheme.

Subsequently, it may be determined whether all physical pages in the page group PG have been completely programmed (S220). The physical page corresponding to the thirty-first word line WL31 has not yet been programmed, and hence the multi-page program operation may proceed to step S230.

In step S230, the selected word line in the page group PG may be changed. The physical page corresponding to the thirtieth word line has been completely programmed, and hence the selected word line may be changed to the thirty-first word line WL31. Subsequently, the multi-page program operation may proceed to step S210 where the first data may be programmed on the physical page corresponding to the thirty-first word line WL31.

Accordingly, the same first data may be programmed in the physical pages corresponding to the thirtieth and thirty-first word lines WL30 and WL31. As a result of the determination in step S220, all physical pages in the page group PG have been completely programmed, and hence the multi-page program on the corresponding page group PG may be completed.

Figure 17:
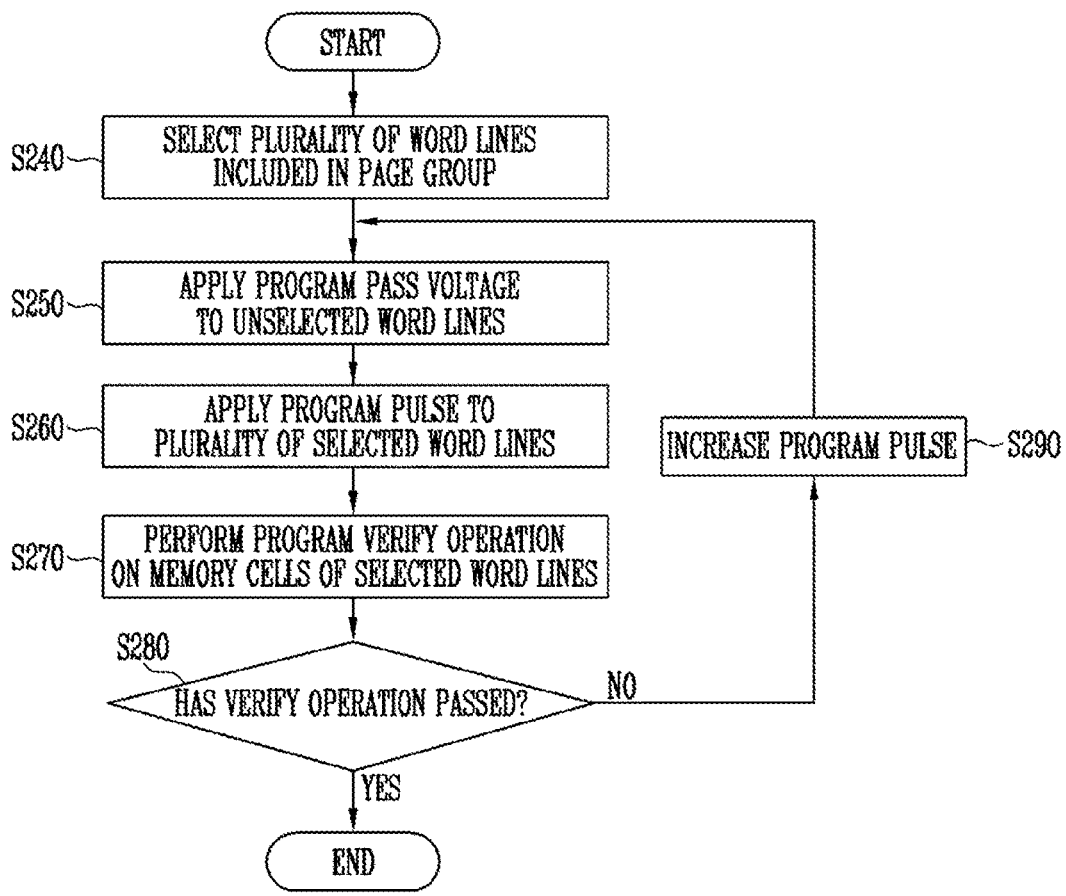
FIG. 17 is a flowchart illustrating another embodiment of the multi-page program operation.

FIG. 17 is a flowchart illustrating another embodiment of the multi-page program operation. That is, an example embodiment of step S200 of FIG. 15 is illustrated in FIG. 17. Hereinafter, this will be described together with reference to FIG. 8.

In step S240, a plurality of word lines included in a page group may be selected. As illustrated in FIG. 8, the thirtieth and thirty-first word lines WL30 and WL31 included in the page group PG may be selected.

In step S250, a program pass voltage may be applied to unselected word lines. As illustrated in FIG. 8, the program pass voltage Vpass1 may be applied to the unselected word lines WL27 to WL29 and WL32 to WL34. It can be seen that the program pass voltage Vpass1 may be applied to other unselected word lines that are not illustrated in FIG. 8.

In step S260, a program pulse may be applied to the plurality of selected word lines. As illustrated in FIG. 8, threshold voltages of program target cells belonging to the page group PG may be increased by applying the program pulse Vpgm to the thirtieth and thirty-first word lines WL30 and WL31. To this end, a program permission voltage may be applied to bit lines coupled to the program target cells. In addition, a program inhibition voltage may be applied to some of the bit lines BL11 to BL15 so as to maintain threshold voltages of memory cells not to be programmed.

Subsequently, in step S270, a program verify operation may be performed on the memory cells of the selected word lines WL30 and WL31. To this end, in step S270, the verify operation may be first performed on the thirtieth word line WL30 and be then performed on the thirty-first word line WL31.

Subsequently, in step S280, it may be determined whether the verify operation on all memory cells belonging to the page group PG has passed. When the verify operation is determined to have passed, the multi-page program operation may be ended. When the verify operation is determined to have not passed, the program pulse may be increased by proceeding to step S290. Subsequently, a subsequent program loop may be performed by proceeding to step S250.

Figure 18:
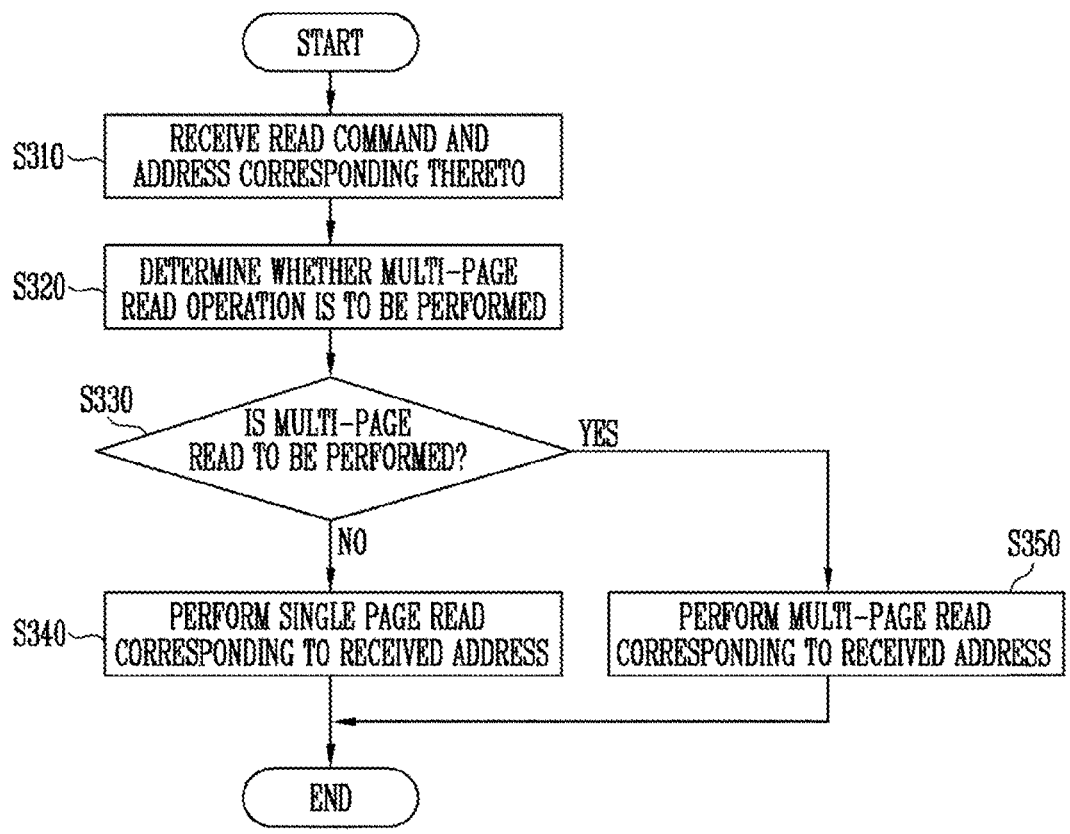
FIG. 18 is a flowchart illustrating a method for operating the semiconductor memory device according to an embodiment of the present disclosure.

FIG. 18 is a flowchart illustrating a method for operating the semiconductor memory device according to an embodiment of the present disclosure.

In step S310, a read command and an address corresponding thereto may be received. The read command and the address may be received from the memory controller to the semiconductor memory device. That is, the read command and the address may be received by the semiconductor memory device from the memory controller.

In step S320, it may be determined whether a multi-page read operation is to be performed. Whether the multi-page read operation is to be performed may be determined by the control logic 140 of the semiconductor memory device 100. In an embodiment, the memory controller may transfer, to the semiconductor memory device 100, a read command indicating that multi-page read is to be performed, and the control logic 140 of the semiconductor memory device 100 may determine whether the multi-page read is to be performed, based on the read command.

As a result of the determination in step S330, when it is determined that the multi-page read is to be performed, the method may proceed to step S350. Subsequently, in step S350, a multi-page read operation corresponding to the received address may be performed. A detailed configuration of the step S350 will be described later with reference to FIG. 19.

As a result of the determination in step S330, when it is determined that the multi-page read is not to be performed, the method may proceed to step S340. Subsequently, in step S340, a single page read operation corresponding to the received address may be performed. The single page read operation may be a typical read operation of reading page data by applying a read voltage to one selected word line and applying a read pass voltage to the other word lines. The single page read operation has been widely known in the art, and therefore, its description will be omitted.

Figure 19:
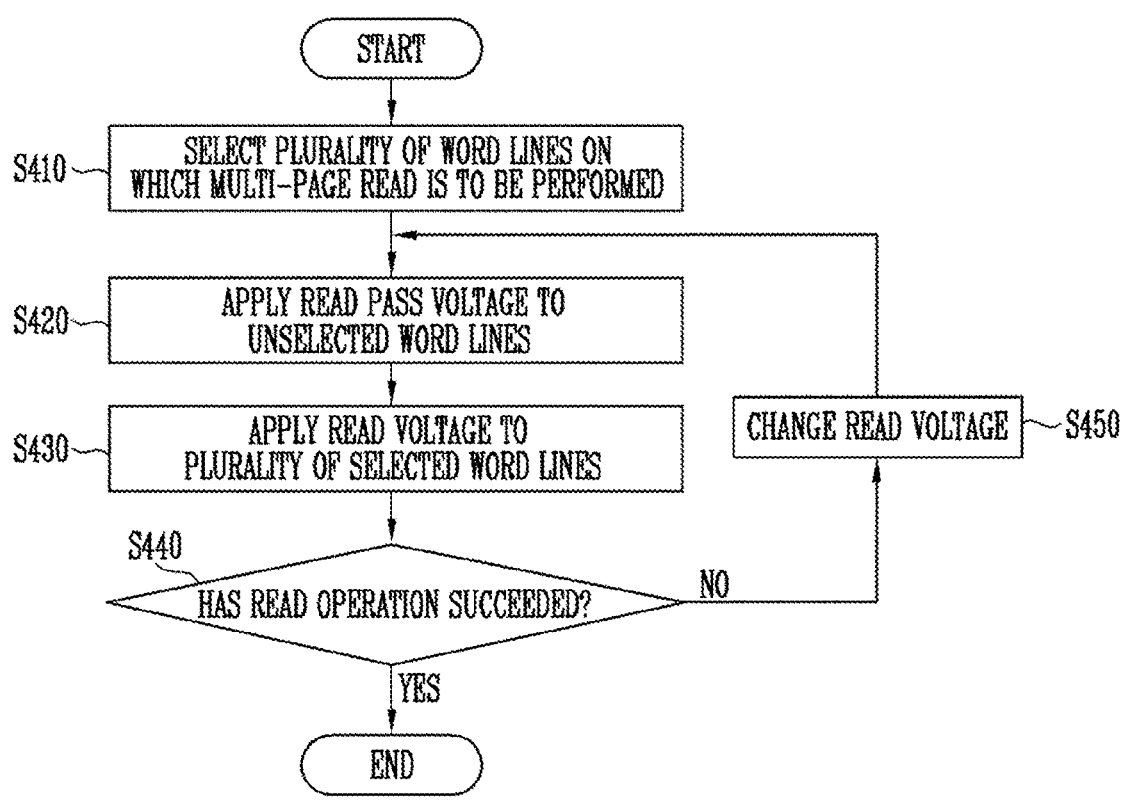
FIG. 19 is a flowchart illustrating a step of performing a multi-page read operation, which is illustrated in FIG. 18.

FIG. 19 is a flowchart illustrating the step of performing the multi-page read operation, which is illustrated in FIG. 18. Hereinafter, this will be described together with reference to FIG. 9.

In step S410, a plurality of word lines on which the multi-page read is performed may be selected. In step S410, the control logic 140 may select a plurality of word lines, based on the address received in step S310 of FIG. 18. As an example, the thirtieth and thirty-first word lines WL30 and WL31 may be selected as illustrated in FIG. 9. In an embodiment, the address received in step S310 of FIG. 18 may include first and second physical page addresses of a selected memory block. In an embodiment, in step 410 of FIG. 19, the control logic 140 may select a plurality of word lines (e.g., WL30 and WL31) corresponding to the first and second physical page addresses of the selected memory block.

In step S420, a read pass voltage may be applied to unselected word lines. As illustrated in FIG. 9, the read pass voltage Vpass2 may be applied to the unselected word lines WL27 to WL29 and WL32 to WL34. It can be seen that the read pass voltage Vpass2 may also be applied to other unselected word lines that are not illustrated in FIG. 9.

In step S430, data stored in the page group PG, corresponding to the plurality of selected word lines, may be read by applying a read voltage to the plurality of selected word lines. As illustrated in FIG. 9, page data may be read by applying the read voltage VR1 to the thirtieth and thirty-first word lines WL30 and WL31. In an embodiment, referring to FIG. 9, data stored in pages corresponding to the thirtieth and thirty-first word lines WL30 and WL31 may be simultaneously read by simultaneously applying a read voltage VR1 to the thirtieth and thirty-first word lines WL30 and WL31. In an embodiment, referring to FIG. 9, data stored in the physical pages belonging to the page group PG may be simultaneously read by simultaneously applying a read voltage VR1 to the thirtieth and thirty-first word lines WL30 and WL31 coupled to the page group PG. As described with reference to FIGS. 9 and 10, when the threshold voltage of any one (e.g., MCc) of the memory cells MCc and MCd is lowered to the read voltage VR1 or less, program data can be normally read based on the threshold voltage of the other memory cell (e.g., MCd), according to the multi-page read operation. Accordingly, the reliability of the read operation of the semiconductor memory device may be improved.

In step S440, it may be determined whether a read operation has succeeded. When the read operation succeeds, the multi-page read operation may be ended. When the read operation fails, the read voltage VR1 may be changed by proceeding to step S450. More specifically, the multi-page read operation may again be performed by changing the voltage level of the read voltage VR1.

As described above, according to the method for operating the semiconductor memory device according to an embodiment of the present disclosure, the same data may be repeatedly programmed in the physical pages belonging to the page group PG. Also, according to the method for operating the semiconductor memory device according to another embodiment of the present disclosure, the multi-page read operation may be performed in the read operation on the page group PG. Accordingly, data can be more reliably read even when the threshold voltages of the memory cells belonging to the page group PG are lowered according to the retention characteristics.

Meanwhile, single-level cells (SLC) have been mainly described with reference to FIGS. 6A, 6B, and 10. However, the present disclosure is not limited thereto, and may be applied to multi-level cells (MLC), triple-level cells (TLC), and memory cells for storing data of four or more bits.

In addition, the present disclosure may be applied to a memory cell array having a two-dimensional structure as illustrated in FIG. 5, and be applied to a memory cell array having a three-dimensional structure as illustrated in FIGS. 2 to 4.

Figure 20:
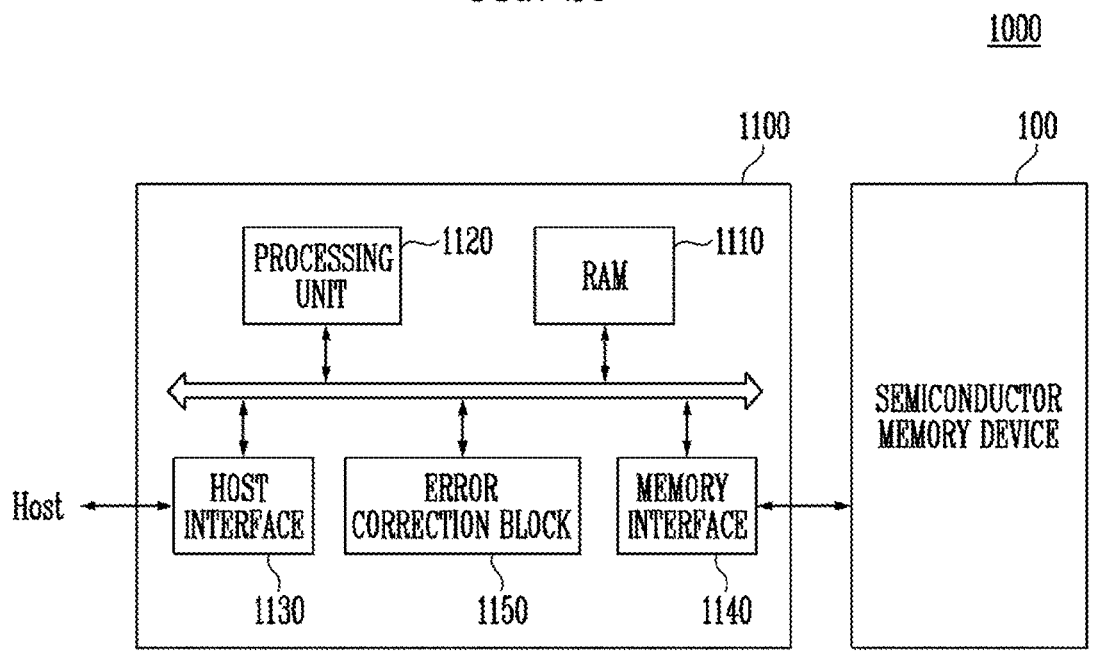
FIG. 20 is a block diagram illustrating an embodiment of a memory system including the semiconductor memory device of FIG. 1.

FIG. 20 is a block diagram illustrating an embodiment 1000 of a memory system including the semiconductor memory device of FIG. 1.

Referring to FIG. 20, the memory system 1000 may include a semiconductor memory device 100 and the controller 1100. The semiconductor memory device 100 may be the semiconductor memory device described with reference to FIG. 1. Hereinafter, overlapping descriptions will be omitted.

The controller 1100 may be coupled to a host Host and the semiconductor memory device 100. The controller 1100 may be configured to access the semiconductor memory device 100 in response to a request from the host Host. For example, the controller 1100 may be configured to control read, write, erase, and background operations of the semiconductor memory device 100. The controller 1100 may be configured to provide an interface between the semiconductor memory device 100 and the host Host. The controller 1100 may be configured to drive firmware for controlling the semiconductor memory device 100.

The controller 1100 may include a Random Access Memory (RAM) 1110, a processing unit 1120, a host interface 1130, a memory interface 1140, and an error correction block 1150. The RAM 1110 may be used as at least one of a working memory of the processing unit 1120, a cache memory between the semiconductor memory device 100 and the host Host, and a buffer memory between the semiconductor memory device 100 and the host Host. The processing unit 1120 may control the overall operations of the controller 1100. In addition, the controller 1100 may temporarily store program data provided from the host Host in a write operation.

The host interface 1130 may include a protocol for exchanging data between the host Host and the controller 1100. In an example embodiment, the controller 1100 may be configured to communicate with the host Host through at least one of various interface protocols such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, an Integrated Drive Electronics (IDE) protocol, and a private protocol.

The memory interface 1140 may interface with the semiconductor memory device 100. For example, the memory interface 1140 may include a NAND interface or a NOR interface.

The error correction block 1150 may be configured to detect and correct an error of data received from the semiconductor memory device 100 by using an Error Correction Code (ECC). The processing unit 1120 may control the semiconductor memory device 100 to adjust a read voltage, based on an error detection result of the error correction block 1150, and to perform re-reading. In an example embodiment, the error correction block 1150 may be provided as a component of the controller 1100.

The controller 1100 and the semiconductor memory device 100 may be integrated into one semiconductor device. In an example embodiment, the controller 1100 and the semiconductor memory device 100 may be integrated into one semiconductor device, to constitute a memory card. For example, the controller 1100 and the semiconductor memory device 100 may be integrated into one semiconductor device, to constitute a memory card such as a PC card (Personal Computer Memory Card International Association (PCMCIA)), a compact flash (CF) card, a Smart Media Card (SM or SMC), a memory stick, a Multi-Media Card (MMC, RS-MMC or MMCmicro), an SD Card (SD, miniSD, microSD or SDHC), or a universal flash storage (UFS).

The controller 1100 and the semiconductor memory device 100 may be integrated into one semiconductor device to constitute a semiconductor drive (Solid State Drive (SSD)). The semiconductor drive SSD may include a storage device configured to store data in a semiconductor memory. If the memory system 1000 is used as the semiconductor drive SSD, the operating speed of the host Host coupled to the memory system 1000 can be remarkably improved.

As another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an example embodiment, the semiconductor memory device 100 or the memory system 1000 may be packaged in various forms. For example, the semiconductor memory device 100 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), Plastic Metric Quad Flat Pack (PMQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi-Chip Package (MCP), Wafer-level Fabricated Package (WFP), or Wafer-level processed Stack Package (WSP).

Figure 21:
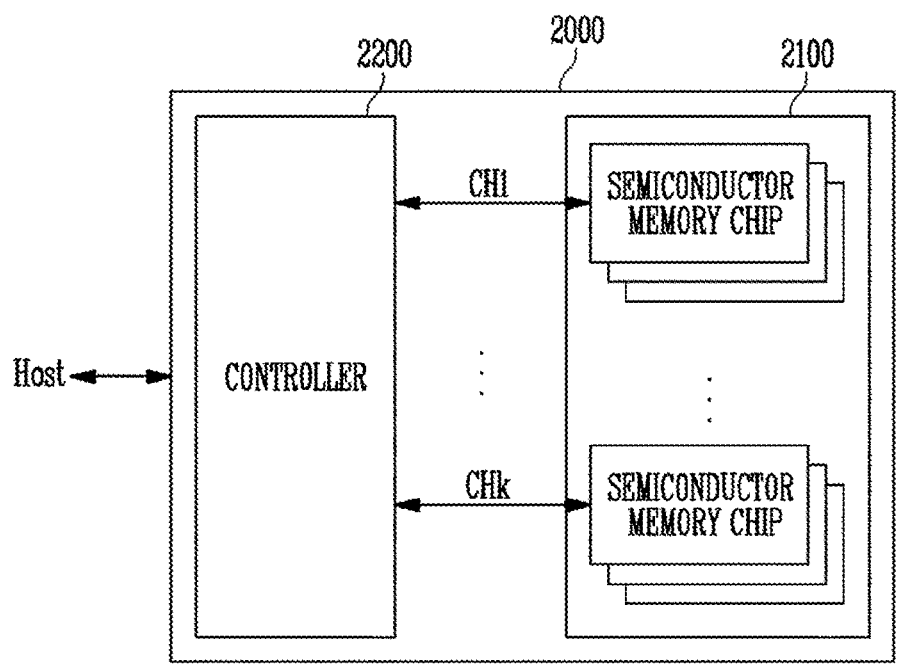
FIG. 21 is a block diagram illustrating an application example of the memory system of FIG. 20.

FIG. 21 is a block diagram illustrating an application example of the memory system of FIG. 20.

Referring to FIG. 21, the memory system 2000 may include a semiconductor memory device 2100 and a controller 2200. The controller 2200 may be coupled to a host Host and the semiconductor memory device 2100. The semiconductor memory device 2100 may include a plurality of semiconductor memory chips. The plurality of semiconductor memory chips may be divided into a plurality of groups.

In FIG. 21, it is illustrated that the plurality of groups may communicate with the controller 2200 through first to kth channels CH1 to CHk. Each semiconductor memory chip may be configured and operated identically to the semiconductor memory device 100 described with reference to FIG. 1.

Each group may be configured to communicate with the controller 2200 through one common channel. The controller 2200 may be configured similarly to the controller 1100 described with reference to FIG. 20. The controller 2200 may be configured to control the plurality of memory chips of the semiconductor memory device 2100 through the plurality of channels CH1 to CHk.

Figure 22:
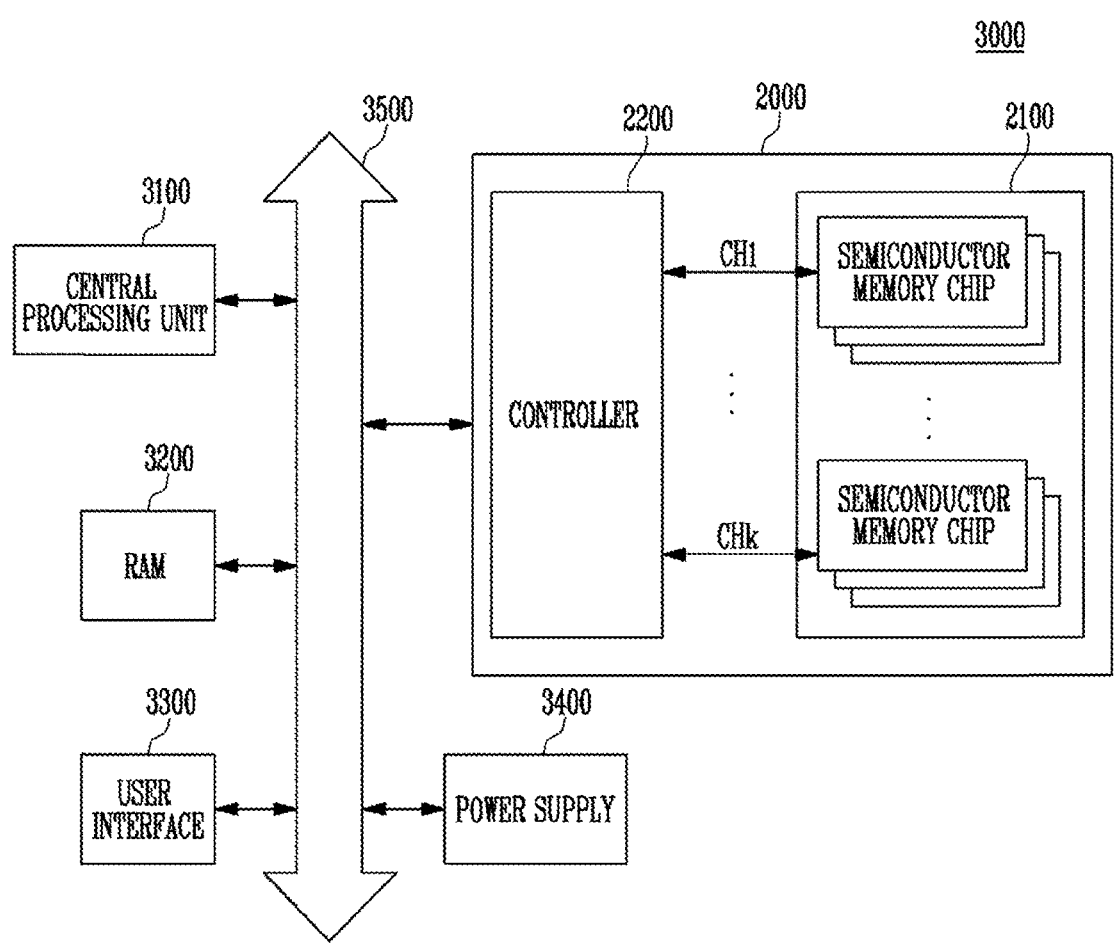
FIG. 22 is a block diagram illustrating a computing system including the memory system described with reference to FIG. 21.

FIG. 22 is a block diagram illustrating a computing system including the memory system described with reference to FIG. 21.

Referring to FIG. 22, the computing system 3000 may include a central processing unit 3100, a RAM 3200, a user interface 3300, a power supply 3400, a system bus 3500, and a memory system 2000.

The memory system 2000 may be electrically coupled to the central processing unit 3100, the RAM 3200, the user interface 3300, and the power supply 3400 through the system bus 3500. Data supplied through user interface 3300 or data processed by the central processing unit 3100 may be stored in the memory system 2000. The memory system 2000 may include a semiconductor memory device 2100 and a controller 2200. The semiconductor memory device 2100 may include a plurality of semiconductor memory chips. The plurality of semiconductor memory chips may be divided into a plurality of groups. The plurality of groups may communicate with the controller 2200 through first to kth channels CH1 to CHk.

In FIG. 22, it is illustrated that the semiconductor memory device 2100 may be coupled to the system bus 3500 through the controller 2200. However, the semiconductor memory device 2100 may be directly coupled to the system bus 3500. The function of the controller 2200 may be performed by the central processing unit 3100 and the RAM 3200.

In FIG. 22, it is illustrated that the memory system 2000 described with reference to FIG. 21 may be provided. However, the memory system 2000 may be replaced by the memory system 1000 described with reference to FIG. 20. In an example embodiment, the computing system 3000 may be configured to include both the memory systems 1000 and 2000 described with reference to FIGS. 20 and 21.

According to the present disclosure, there can be provided a semiconductor memory device having improved reliability.

Further, according to the present disclosure, there can be provided a method for operating a semiconductor memory device having improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
a memory cell array including a plurality of memory blocks;
a peripheral circuit configured to perform a multi-page read operation on a selected memory block among the plurality of memory blocks; and
a control logic configured to control wherein the peripheral circuit to select a first word line and a second word line, both of which are coupled to the selected memory block, and which control the peripheral circuit to perform the multi-page read operation on the first and second word lines;
wherein the peripheral circuit performs the multi-page read operation by applying a read pass voltage to unselected word lines and at substantially the same time that the read pass voltage is applied to unselected word lines, substantially simultaneously applying a read voltage to both the first word line and the second word line;
wherein, data is read from two different memory pages at substantially the same time.

2. The semiconductor memory device of claim 1, wherein the same data is stored in a physical page corresponding to the first word line and a physical page corresponding to the second word line.

3. The semiconductor memory device of claim 1, wherein the selected memory block is divided into a plurality of page groups,
wherein the peripheral circuit performs a multi-page read operation on a selected page group, among the plurality of page groups, coupled to the first word line and the second word line.

4. The semiconductor memory device of claim 3, wherein the peripheral circuit performs the multi-page read operation by applying the read pass voltage to word lines that are not coupled to the selected page group and applying the read voltage to word lines coupled to the selected page group.

5. The semiconductor memory device of claim 3, wherein each of the plurality of page groups includes physical pages located adjacent to each other.

6. The semiconductor memory device of claim 3, wherein each of the plurality of page groups includes physical pages located to be spaced apart from each other.

7. The semiconductor memory device of claim 1, wherein the plurality of memory blocks includes a content addressable memory block.

8. A method for operating a semiconductor memory device including a plurality of memory blocks, the method comprising:
receiving a read command and an address corresponding to the read command;
performing a multi-page read operation corresponding to the received address, the address denoting at least two word lines including a first word line and a second word line;
wherein, in the performing of the multi-page read operation, data of a plurality of pages, corresponding to a plurality of word lines coupled to a selected memory block are read substantially simultaneously, by applying a read voltage to both the first word line and to the second word line at substantially the same time;
wherein, the same data of the plurality of pages is read from the plurality of pages at substantially the same time.

9. The method of claim 8, wherein the address corresponding to the read command includes a first physical page address corresponding to the first word line and a second physical page address corresponding to the second word line, which are included in the selected memory block,
wherein the performing of the multi-page read operation includes:
selecting the first word line corresponding to the first physical page address and the second word line;
applying a read pass voltage to unselected word lines among the word lines coupled to the selected memory block; and
substantially simultaneously applying a read voltage to the selected first and second word lines.

10. The method of claim 9, further comprising, determining whether a read operation has succeeded after the applying of the read voltage to the selected first and second word lines.

11. The method of claim 8, wherein the data of the plurality of pages corresponding to the plurality of word lines coupled to the selected memory block are the same.

12. A method for operating a semiconductor memory device including a memory block having at least one page group, each page group having a plurality of physical pages, the method comprising:
receiving a read command for the memory block having the at least one page group and an address corresponding to the read command; and
performing a multi-page read operation on a selected page group corresponding to the received address,
wherein, in the performing of the multi-page read operation, data of different physical pages included in the selected page group are read simultaneously such that the data from the different memory paces is read from the different memory pages at substantially the same time.

13. The method of claim 12, wherein the performing of the multi-page read operation includes:
applying a read pass voltage to word lines that are not coupled to the selected page group; and
at substantially the same time, applying a read voltage to word lines coupled to the selected page group.

14. The method of claim 12, wherein a plurality of physical pages belonging to the selected page group store the same data.

15. The method of claim 12, wherein the selected page group includes physical pages located adjacent to each other.

16. The method of claim 12, wherein the selected page group includes physical pages located to be spaced apart from each other.

* * * * *